United States Patent
Aruga

[19]

[11] Patent Number: 5,877,086
[45] Date of Patent: Mar. 2, 1999

[54] METAL PLANARIZATION USING A CVD WETTING FILM

[75] Inventor: Michio Aruga, Inba-gun, Japan

[73] Assignee: Applied Materials, Inc., Santa Clara, Calif.

[21] Appl. No.: 893,871

[22] Filed: Jul. 11, 1997

[30] Foreign Application Priority Data

Jul. 12, 1996 [JP] Japan ..................................... 8-183729

[51] Int. Cl.$^6$ ..................................................... H01L 21/44
[52] U.S. Cl. ........................... 438/653; 438/654; 438/655; 438/675; 438/680; 257/751; 257/753; 257/757
[58] Field of Search ..................................... 438/637, 643, 438/644, 645, 649, 653, 654, 655, 675, 680, 692, 699, 702, 703; 216/38; 257/750, 751, 752, 753, 754, 757, 770

[56] References Cited

U.S. PATENT DOCUMENTS

| | | |
|---|---|---|
| 4,920,073 | 4/1990 | Wei et al. . |
| 4,938,996 | 7/1990 | Ziv et al. . |
| 4,960,732 | 10/1990 | Dixit et al. . |
| 4,985,750 | 1/1991 | Hoshino . |
| 4,994,410 | 2/1991 | Sun et al. . |
| 5,091,339 | 2/1992 | Carey . |
| 5,147,819 | 9/1992 | Yu et al. . |
| 5,231,056 | 7/1993 | Sandhu . |
| 5,250,465 | 10/1993 | Iizuka et al. . |
| 5,292,558 | 3/1994 | Heller et al. . |
| 5,354,712 | 10/1994 | Ho et al. . |
| 5,480,836 | 1/1996 | Harada et al. . |
| 5,585,308 | 12/1996 | Sardella . |
| 5,585,673 | 12/1996 | Joshi et al. . |
| 5,647,952 | 7/1997 | Chen ..................................... 216/38 X |

FOREIGN PATENT DOCUMENTS

| | | |
|---|---|---|
| 3743591A1 | 12/1987 | Germany . |
| 8-10693 | 1/1986 | Japan . |
| 63-9925 | 1/1988 | Japan . |

*Primary Examiner*—William Powell
*Attorney, Agent, or Firm*—Patterson & Associates

[57] ABSTRACT

The present invention is a process for planarization of substrate layers comprising apertures to form continuous, void-free contacts or vias in sub-half micron applications. A CVD silicon or metal silicide wetting layer is deposited onto the substrate layer comprising apertures to provide a conformal wetting layer for a PVD metal layer. The PVD metal layer is deposited onto the previously formed CVD metal layer at a temperature below that of the melting point temperature of the metal. The CVD layer diffuses into the PVD layer and the resulting conductive layer is substantially void-free. The planarization process is preferably carried out in a multi-chamber system that includes both PVD and CVD processing chambers so that once the substrate is introduced into a vacuum environment, the filling of vias and contacts occurs without the formation of an oxide layer over the CVD wetting layer.

24 Claims, 5 Drawing Sheets

METAL PLANARIZATION USING A CVD WETTING FILM

FIELD OF THE INVENTION

The present invention relates to a metal planarization process for manufacturing semiconductor devices. More particularly, the present invention relates to filling apertures in a substrate layer by deposition of a metal conducting layer.

BACKGROUND OF THE INVENTION

Sub-half micron multilevel metallization is one of the key technologies for the next generation of very large scale integration ("VLSI"). The multilevel interconnections that lie at the heart of this technology require planarization of high aspect ratio apertures, including contacts, vias, lines or other features. Reliable formation of these interconnects is very important to the success of VLSI and to the continued effort to increase circuit density and quality on individual substrates and die.

Aluminum (Al) layers formed by chemical vapor deposition ("CVD"), like other CVD processes, provide good conformal aluminum layers, i.e., a uniform thickness layer on the sides and base of the feature, for very small geometries, including sub-half micron (<0.5 μm) apertures, at low temperatures. However, transmission electron microscopy data ("TEM") has revealed that voids exist in many of the CVD formed Al layers within high aspect ratio apertures even though electric tests of these filled apertures do not evidence the existence of this void. If the layer is subsequently processed, the void can result in a defective circuit. Electric conductivity tests do not detect any structural abnormalities. However, despite the generally positive electric conductivity tests, conduction through a contact or via having a void may, over time, compromise the integrity of the integrated circuit devices.

A TEM study of various CVD Al layers formed on substrates indicates that the formation of voids occurs through a key hole process wherein the top portion of an aperture such as a via becomes sealed before the aperture has been entirely filled. Although a thin conformal layer of CVD Al can typically be deposited in high aspect ratio contacts and vias at low temperatures, continued CVD deposition to complete filing of the contacts or vias typically results in the formation of voids therein. Extensive efforts have been focused on elimination of voids in metal layers by modifying CVD processing conditions. However, the results have not yielded a void free structure.

An alternative technique for metallization of high aspect ratio apertures, is hot planarization of aluminum through physical vapor deposition ("PVD"). The first step in this process requires deposition of a thin layer of a refractory metal such as titanium (Ti) on a patterned wafer to form a wetting layer which facilitates flow of the Al during the PVD process. Following deposition of the wetting layer, the next step requires deposition of either (1) a hot PVD Al layer (e.g., about 450° C.) or (2) a cold PVD Al layer (e.g., about room temperature) followed by heating the PVD Al layer (e.g., about 450° C.) to reflow the Al into apertures in the wetting layer. However, PVD Al processes are very sensitive to the quality of the wetting layer, wafer condition, and other processing parameters. Small variations in processing conditions and/or poor coverage of the PVD Ti wetting layer results in incomplete filling of the contacts or vias, thus creating voids. In order to reliably fill the vias and contacts, hot PVD Al processes are performed at temperatures above about 450° C. Because the PVD Ti process provides poor coverage of the sidewalls of high aspect ratio, sub-micron vias, PVD Al does not provide reliable filling of the contacts or vias. Even at higher temperatures, PVD processes may result in a bridging effect whereby the mouth of the contact or via is closed because the deposition layer formed on the top surface of the substrate and the upper walls of the contact or via join before the floor of the contact or via has been completely filled.

A known planarization technology for depositing a PVD aluminum film on a semiconductor wafer 1 is shown in FIG. 1. The semiconductor wafer 1 in the illustration was equipped with the multiple layers of insulating films 4, 5 having a hole 3 on top of the semiconductor substrate 2. Optionally, an electrode wiring (not illustrated) is formed between the multiple layers of the insulating films 4, 5. On the semiconductor wafer 1, Titanium (hereinafter, called "Ti") and titanium nitride (hereinafter, called "TiN") were successively deposited by the sputtering method, which is one PVD (Physical Vapor Deposition) method. By this method, a barrier metal film 6 of Ti or TiN is formed. Next, on top of this barrier metal film 6, a wettability-improving film 7 comprising titanium Ti, which is superior in wettability to aluminum, is formed by the sputtering method, and aluminum 8 is formed into a film at room temperature. Then, by means of applying heat to the semiconductor wafer 1, the aluminum is caused to reflow, or, while the aluminum is being formed into a film by a high-temperature sputtering method, it is made to flow into the hole 3 at the same time. However, with the above-mentioned prior method, the aluminum was not completely imbedded in the inner section of the hole 3, and there was a tendency for an air space to be created in its bottom section. This was because in the sputtering method, the wettability-improving film 7 could not sufficiently cover to the bottommost section of the hole side wall faces. In order to improve the coverage of the wettability-improving film 7 on the hole side wall faces, it is also actually possible to form a film of Ti by means of the CVD method. However, since CVD Ti is generally conducted at a high temperature, this is counter to the preference for low-temperature processes of recent years.

Once a PVD Al layer has been deposited onto the substrate, reflow of the Al may occur by directing ion bombardment towards the substrate itself Bombarding the substrate with ions causes the metal layer formed on the substrate to reflow. This process typically heats the metal layer as a result of the energy created by the plasma and resulting collisions of ions onto the metal layer. The generation of high temperatures of the metal layers formed on the substrate compromises the integrity of devices having sub-half micron geometries. Therefore, heating of the metal layers is disfavored in these applications.

U.S. Pat. No. 5,147,819 ("the '819 patent") discloses a process for filling vias that involves applying a CVD Al layer with a thickness of from 5 percent to 35 percent of the defined contact or via diameter, then applying a sufficiently thick PVD Al layer to achieve a predetermined overall layer thickness. A high energy laser beam is then used to melt the intermixed CVD Al and PVD Al. However, this process requires heating the wafer surface to a temperature no less than 660° C. Such a high temperature is not acceptable for most sub-half micron technology. Furthermore, the use of laser beams scanned over a wafer may affect the reflectivity and uniformity of the metal layer processed therewith.

The '819 patent also discloses that suicide layers and/or barrier metal layers may be deposited onto a wafer before Al is deposited first by a CVD process and then a PVD process.

According to the teachings of this reference, these additional underlying layers are desirable to increase electrical conduction and minimize junction spiking.

U.S. Pat. No. 5,250,465 ("the '465 patent") discloses a process similar to the '819 patent using a high energy laser beam to planarize intermixed CVD/PVD metal structures. Alternatively, the '465 patent teaches the application of a PVD Al layer formed at a wafer temperature of about 550° C. However, during the high temperature sputtering process, ion bombardment due to the plasma raises the surface temperature to about 660° C. causing the Al film to melt and planarize. Like the process of the '819 patent, the use of high temperatures is unacceptable for most sub-half micron applications, and particularly for use in filling high aspect ratio sub-half micron contacts and vias. Subjecting wafers to temperatures high enough to melt intermixed CVD/PVD metal layers can compromise the integrity of devices formed on the substrate, in particular where the process is used to planarize a metal layer formed above several other metal and dielectric layers.

Other attempts at planarization of high aspect ratio sub-half micron contacts and vias using known reflow or planarization processes at lower temperatures have resulted in dewetting of the CVD Al from the silicon dioxide ($SiO_2$) substrate and the formation of discontinuous islands of the CVD Al on the side walls of the vias. The discontinuous islands prevent flow or diffusion of an additional material layer there over, leaving a void in the via. In order for the CVD Al to resist dewetting at lower temperatures, the thickness of the CVD Al has to be several thousand Angstroms (Å). Since ten thousand Angstroms equal one micron, a CVD Al layer of several thousand Angstroms on the walls of a sub-half micron via will completely seal the via and form voids.

Therefore, there remains a need for a low temperature metallization process for filling apertures, particularly high aspect ratio sub-half micron contacts and vias. More particularly, it would be desirable to have a low temperature process for filling such contacts and vias with only a thin CVD layer and allowing the via to then be filled with a PVD metal such as PVD Al.

SUMMARY OF THE INVENTION

The present invention provides a process for planarization of a substrate layer having apertures. First, a silicon or silicide wetting layer is formed on a substrate in a CVD chamber. Then a PVD metal layer is deposited over the CVD wetting layer. The wetting layer is a thin non-conducting dielectric layer which promotes deposition of the conductive PVD metal layer and preferably diffuses into the PVD layer to provide a uniform conductive layer.

The present invention deposits a uniform conductive layer which forms continuous, void-free contacts or vias, including contacts and vias in sub-half micron applications. In one aspect of the invention, a Ti/TiN barrier layer is deposited on a substrate layer having apertures, then a non-conducting silicon or silicide wetting layer is deposited in a CVD chamber onto the barrier layer. A PVD layer comprising a conductive metal is then deposited in a PVD chamber onto the CVD layer at a temperature below that of the melting point of the metal. The CVD layer preferably diffuses into the PVD layer and the resulting conductive layer is substantially void-free.

In another aspect of the invention, the planarization process is carried out in an integrated processing system that includes both PVD and CVD processing chambers. Once the substrate is introduced into a vacuum environment, the planarization of the apertures occurs without the formation of an oxide layer over the CVD layer. This result is achieved because the substrate is not transferred from one processing system to another system to undergo deposition of the CVD and PVD layers. Accordingly, the substrate remains under vacuum pressure thereby preventing formation of detrimental oxide layers. Furthermore, diffusion of dopants deposited with the PVD layer into the CVD layer is improved by sequential deposition in the integrated system.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

DETAILED DESCRIPTION OF THE INVENTION

Figure 1:
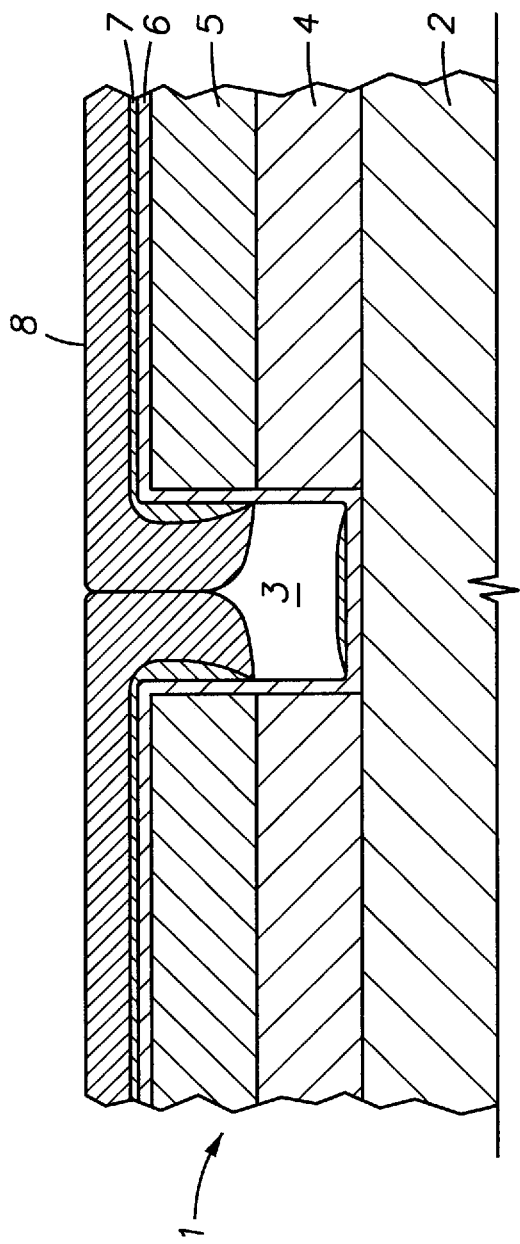
FIG. 1 (Prior art) is an enlarged cross-sectional view showing an outline of the construction of a semiconductor device used until now.

The present invention provides a method for planarization of a substrate layer having apertures, particularly sub-micron apertures having high aspect ratios. First, a non-conducting silicon or silicide wetting layer is formed using a CVD process on the substrate layer having apertures. Then a conductive PVD metal layer is deposited over the CVD wetting layer. The wetting layer promotes even deposition of the PVD layer and preferably diffuses into the PVD layer to provide a uniform conductive layer.

The CVD wetting layer comprises silicon or a silicide, and preferably consists essentially of silicon or tungsten silicide ($WSi_x$). The wetting layer preferably has a thickness from 50 to 300 Å, most preferably from about 80 to 100 Å. The wetting layer is preferably deposited by thermal decomposition of disilane or by reaction of $WF_6$ and $SiH_4$.

The PVD metal layer can comprise aluminum, copper, or other metals, but preferably comprises at least 99% by weight of aluminum or copper, or a mixture thereof. The metal layer is preferably deposited in a PVD process at a wafer temperature below about 450° C. After depositing of the metal layer, the PVD and CVD layers may diffuse together into a uniform conductive layer.

In a preferred embodiment of the invention, a barrier layer such as Ti/TiN is deposited by a PVD process on a substrate layer such as one or more patterned silicon oxide layers. The barrier layer preferably has a thickness between about 5 and about 700 Å, most preferably between about 100 and 200 Å. The silicon or tungsten silicide wetting layer is then deposited over the barrier layer by the CVD process. Then the PVD layer comprising at least 99% aluminum or copper, or a mixture thereof, is deposited onto the CVD layer at a substrate temperature below that of the melting point of the metal. The CVD layer promotes even deposition of the PVD layer and then diffuses into the PVD layer resulting in a conductive layer which is substantially void-free.

In another aspect of the invention, the metallization process is carried out in an integrated processing system that includes both PVD and CVD processing chambers. Once the substrate is introduced into a vacuum environment, the planarization of the apertures occurs without the formation of an oxide layer over the CVD layer. This results because the substrate need not be transferred from one processing system to another system to undergo deposition of the CVD and PVD deposited layers. Accordingly, the substrate remains under vacuum pressure thereby preventing formation of detrimental oxide layers. Furthermore, diffusion of dopants deposited with the PVD layer into the CVD layer is improved by simultaneous deposition in the integrated system.

A staged-vacuum wafer processing system which is readily configured to contain both PVD and CVD chambers is disclosed in U.S. Pat. No. 5,186,718, entitled Staged-Vacuum Wafer Processing System and Method, Tepman et al., issued on Feb. 16, 1993, which disclosure is hereby incorporated herein by reference. The integrated processing system comprises a multiplicity of isolatable communicating chambers including load lock chambers, CVD processing chambers, and PVD processing chambers. The apparatus further comprises an intermediate substrate transport region and vacuum means communicating with the isolatable regions for establishing a vacuum gradient of decreasing pressure across the apparatus from the load lock chamber to the processing chambers.

According to the present invention, a silicon or silicide wetting layer is deposited in a CVD chamber to form a substantially continuous cap over a substrate layer having apertures. The substrate layer can be one or more silicon oxide dielectric layers which include semi-conductor regions and can include a barrier layer which inhibits diffusion between the dielectric layers and a conductive layer.

The preferred reactions for deposition of the wetting layer are the thermal decomposition of disilane or the reaction of $WF_6$ and $SiH_4$ according to the following equations:

wherein x averages at least about 1.5, preferably at least about 2.

After deposition of the wetting layer, the substrate is moved, preferably under vacuum, to a PVD chamber to deposit the metal layer at a wafer temperature initially from about room temperature to about 450° C. The metal layer starts to flow during the PVD deposition process at about 400° C. Thus, before filling of the apertures is completed, it is preferred to continue deposition of the metal layer above 400° C. to achieve planarization of the metal layer or to heat the substance above 400° C. after deposition of the metal layer. The wetting layer enables planarization of the metal to be achieved at temperatures far below the melting point of the metal without separation from the layer having apertures.

It is most preferred that the Al metal layer further comprise copper (Cu) sputtered along with the aluminum in a simultaneous PVD AlCu process. This is preferably provided by a sputter source comprised of an aluminum copper alloy, typically aluminum with about 1% copper alloyed therewith. When the PVD AlCu layer follows the CVD deposition without exposure to oxygen, no oxide layer can form between the layers.

It is also preferred that the top surface of the PVD layer receive a PVD TiN anti-reflection coating ("ARC") for reducing the reflectivity of the surface and improving the photo lithographic performance of the layer.

Figure 2:
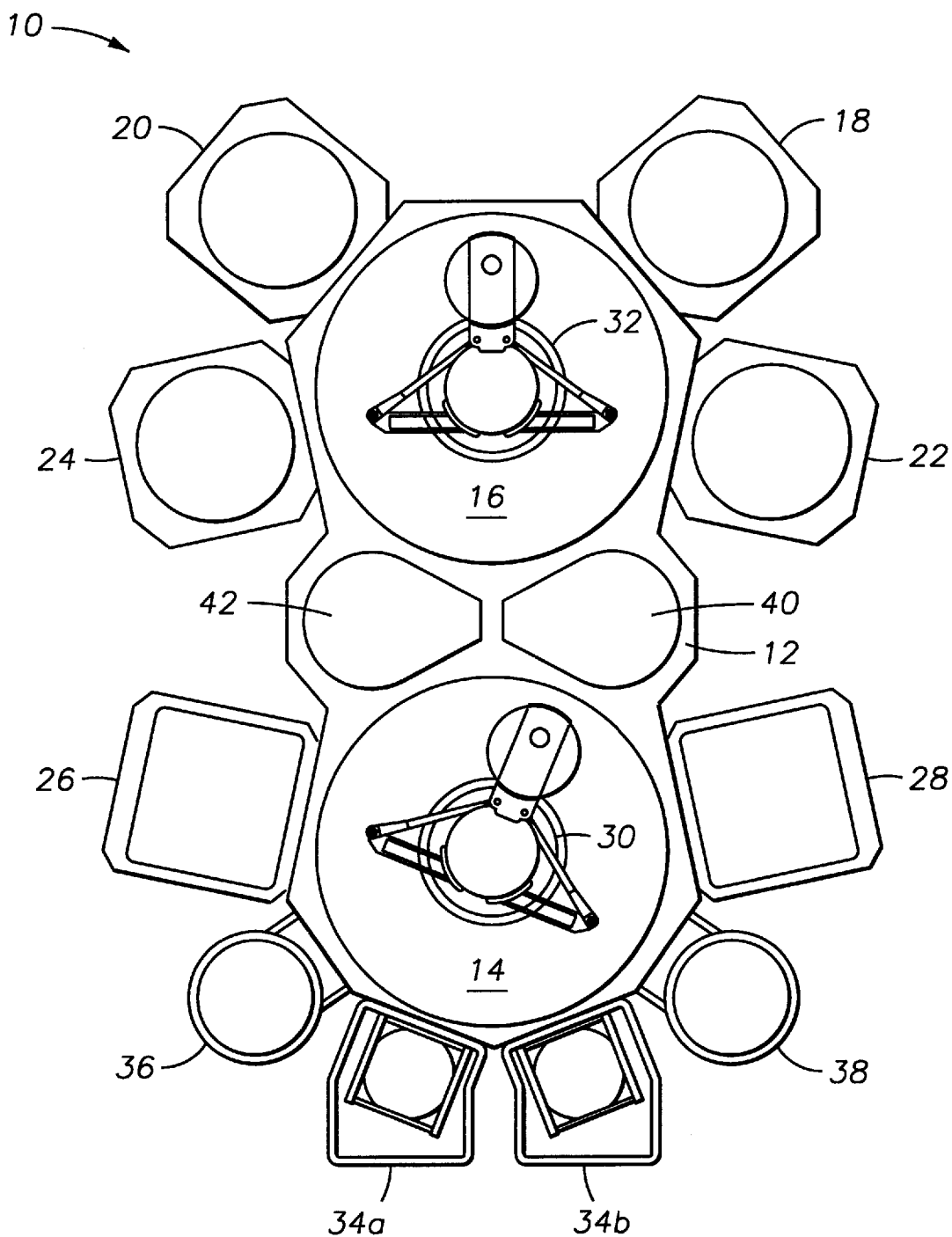
FIG. 2 is a cross-sectional view showing an outline of one utility model configuration of a film-forming device to which this invention is applied.

FIG. 2 is a cross-sectional view of film-forming device 10 related to this invention. In the above-mentioned device, the main frame 12 is formed of the one piece molded construction of aluminum referred to as monolithic, and is made so as to be able to maintain a high degree of vacuum by eliminating welded sections. Also, the main frame 12 is constructed mainly of the two chambers comprising the buffer chamber (first vacuum chamber) 14 and the transfer chamber (second vacuum chamber) 16. Three PVD chambers 18, 20, 22 and a degassing chamber 24 are attached on the periphery of the transfer chamber 16. The first PVD chamber 18 is used for the purpose of forming a film of a barrier metal comprising Ti and TiN or the like by means of the sputtering method. Also, the second and third PVD chambers 20, 22 are used for the purpose of forming a film or aluminum or its alloys by means of the sputtering method. In particular, the third PVD chamber 22 is also equipped with a device (not illustrated) for the purpose of heating the semiconductor device that is to be processed. Also, the degassing chamber 24 is used for the purpose of thermally processing the semiconductor wafer at a high temperature.

Different than the film-forming device used until now, two CVD chambers 26, 28 for the purpose of conducting film forming by means of the CVD method are attached on the periphery of the buffer chamber 14. Also, an $Si_2H_6$ gas supply source (not illustrated) for the purpose of supplying disilane (hereinafter, called "$Si_2H_6$") and a device that heats the CVD chambers 26, 28 are connected to the CVD chambers 26, 28.

Two load-and-lock chambers 34a, 34b are arranged on the periphery of the buffer chamber 14, and can always preserve the vacuum by not opening the buffer and transfer chambers 14, 16 to the atmosphere. The degassing orientation chamber 36 is arranged positioned adjacent only to one of the load-and-lock chambers 34a, and conducts the adjustment for the degassing and orientation flat of the semiconductor wafer with holes. A water cooled type of cool down chamber 38 is arranged positioned adjacent to the other load-and-lock chamber 34b. Also, a cool down chamber 40 of the same type as mentioned above, and the precleaning chamber 42, which removes the oxide and nitride thin films that have been formed on the semiconductor wafer surface as a preprocessing, are provided between the buffer chamber 14 and the transfer chamber 16.

All of the above-mentioned chambers are interconnected, and each interconnecting section is cut off by a valve (not illustrated) that can be opened and closed. By means of these valves, the film-forming device 10 for an aluminum material shown in FIG. 2 is made a construction that is partitioned of the five stages from the load-and-lock chambers 34a, 34b to the first to third PVD chambers 18, 20, 22, and the degree of vacuum can be gradually increased at each stage. In other words, the pressure is made $1 \times 10^{-5}$ torr at the load-and-lock chamber 34a, 34b, is made $1 \times 10^{-6}$ torr at the buffer chamber 14 and the degassing and orientation and the reclaiming chambers 36, 38; is made $1\times 10^{-7}$ torr at the preclean chamber 42, at the transfer chamber 16 it is made $1\times 10^{-8}$ torr; then, it can be made $1\times 10^{-7}$ torr at the first to third PVD chambers and the degassing chamber 18, 20, 22, 24. Now then, even the CVD chambers 26, 28 are made a comparatively low pressure (for example, $1\times 10^{-6}$ torr). Because of this, even when a valve is opened between the buffer and the transfer chambers 14, 16, the $Si_2H_6$ gas that is used in the CVD method at the CVD chambers 26, 28 passes through the transfer chamber 16, and is made so as not to disperse in the first to third PVD chambers and the degassing chambers 18,20,22,24. Therefore, close communication between the chambers can be prevented. Also, the CVD chambers 26, 28 are provided adjacent to the buffer chamber 14, but can also be provided adjacent to the transfer chamber 16 in response to the pressure used. Also, the robot arms 30, 32 can be provided internally in the buffer and transfer chambers 14, 16 so that the semiconductor wafer to be processed can be transported to each chamber. Also, although not shown in the figure, each of the above-mentioned chambers can have a susceptor for the purpose of carrying this semiconductor wafer.

Figure 3:
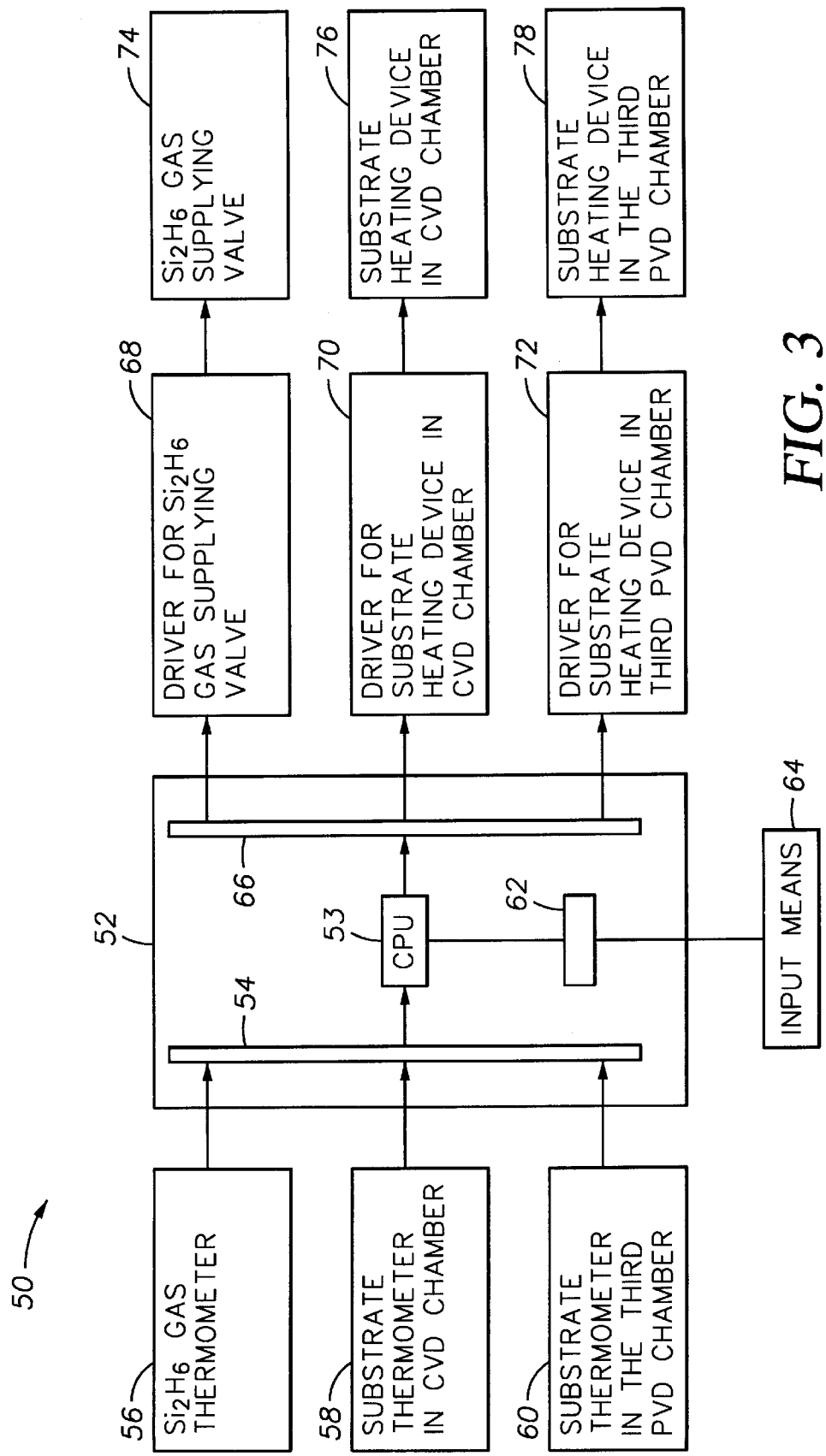
FIG. 3 is a block diagram showing the control means of the film-forming device for an aluminum material of this invention, and one example of its connecting elements.
Figure 4A:
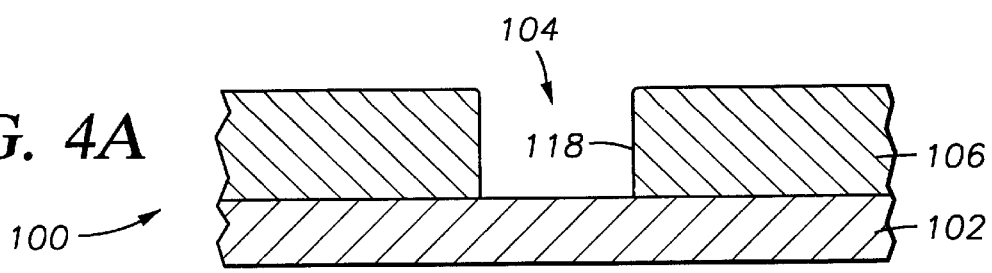
FIG. 4 is a process diagram showing one utility model configuration for the film-forming method for an aluminum material of this invention.
Figure 4B:
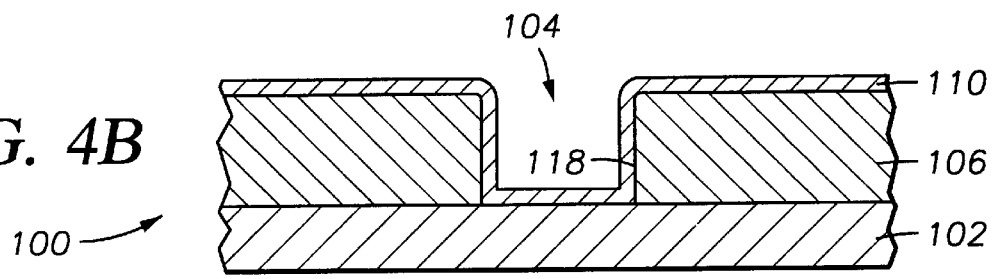
Figure 4C:
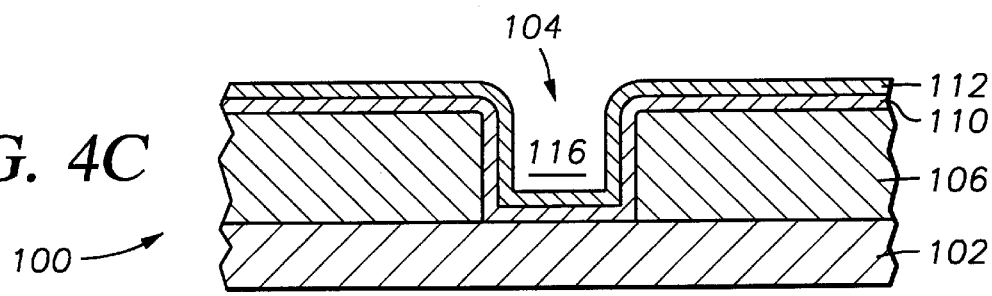
Figure 4D:
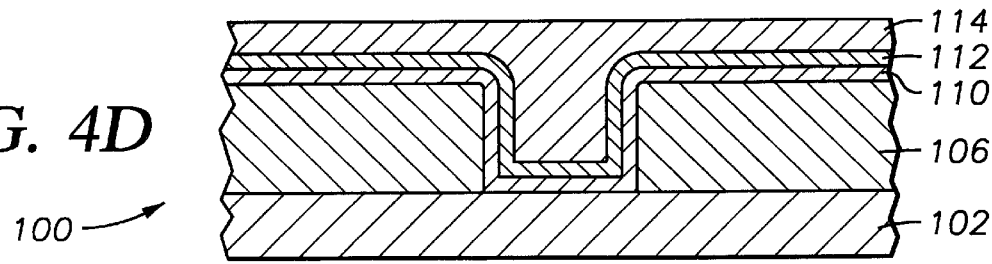

With this type of a film-forming device, the $Si_2H_6$ gas flow volume, and the temperature of the semiconductor wafer within the CVD chambers 26, 28 and the PVD chambers 18, 20, 22 are controlled by means of a control device 50, such as the microcomputer shown in FIG. 3. This control device 50, as is shown in the figure, is constructed centered about the microcomputer 52. A $Si_2H_6$ gas flow meter 56 and the thermometers 58, 60 that measure the temperature of the wafer within the CVD chamber to transmit the signal to the microcomputer 52 and the PVD chamber are connected to the CPU 53 of the microcomputer 52 through the medium of the input interface 54. Also, an input means 64 comprising, for example, a keyboard, is connected to the CPU 53 through the medium of the input interface 62. When the desired values for the gas flow volume and the temperature are input from this input means 64, the above-mentioned values are made so as to be transmitted to the microcomputer 52. Also, the $Si_2H_6$ gas supply valve driver 68 and the substrate heater device drivers 70, 72 within the CVD chamber and the PVD chamber are connected to the CPU 53 of the microcomputer 52 through the medium of the output interface 66. Also, these are respectively connected to the $Si_2H_6$ gas supply valve 74 and the substrate heating devices 76,78. Therefore, the control device 50 constructed in this manner is made so as to regulate the $Si_2H_6$ gas flow volume and the substrate temperatures based on the measured values and the set values.

An explanation is given by referencing FIG. 4 in regard to an embodiment configuration related to the firm-forming method for an aluminum material of this invention by using a device that is constructed such as the above.

First, by using a vacuum pump (not illustrated), the degree of vacuum of each partitioned stage (load-and-lock chamber 34a, 34b, buffer chamber 14, preclean chamber 42, transfer chamber 16, and the first to third PVD chambers 18, 20, 22 is gradually increased, and the pressure within the second and third PVD chambers 20, 22 in particular are made a very high vacuum of $1\times 10^{-9}$ torr. Next, the connecting sections with the load-and-lock chamber 34a, 34b and the buffer chamber 14 are closed by the valve, and the inside of the load-and-lock chambers 34a, 34b are made atmospheric pressure. Then, the orientation flat for the semiconductor wafer 100 (refer to FIG. 4 (a)) in which hole 104 has been formed and which has a single layer of an insulating film 106, is adjusted beforehand, and the semiconductor wafer 100 is placed on the prescribed position on a given susceptor inside this. Then, after the semiconductor wafer 100 has been shifted to the susceptor of the degassing and orientation chamber 36 by using the transport robot arm 30, the degassing of the semiconductor wafer 100 surface and the minute adjustments of the orientation flats of the semiconductor wafer 100 are conducted.

The semiconductor wafer 100 that has been treated as above is shifted into the preclean chamber 42 with the transport robot arm 30, and the natural oxide film and the like on the surface of the semiconductor wafer 100 are removed (not illustrated). Next, using the transport robot arm 32, this semiconductor wafer 100 is loaded onto the susceptor within the PVD chamber 18. Then, in the same method as used in the past, by means of the sputtering method, Ti and TiN are successively formed as films as the barrier metal film 110 on the semiconductor wafer 100 surface (refer to FIG. 4 (b). However, since the aspect ratio for the hole is high, and the sputtering method was used, there are cases wherein the film forming material has not sufficiently covered the bottom section of the inner wall face 118 of hole 104.

Next, the semiconductor wafer 100 is shifted to the susceptor within either CVD chamber 26, 28 through the transfer and buffer chambers 16, 14 with the transport robot arms 32, 30. Since this film-forming device 10 is an integrated device having a multiple chamber system that is equipped with a number of chambers, the surface configuration can be modified without this semiconductor wafer 100 surface being oxidized by exposure to the atmosphere. In this configuration, the desired amount of $Si_2H_6$ gas is introduced to and fills the CVD chamber 26 from the $Si_2H_6$ gas supply source. After that, by means of making the pressure and the temperature within the CVD chamber 26 about 1 torr and 300°–450° C., the $Si_2H_6$ is made to pyrolyze, and silicon is formed in a thin film as the wettability-improving film 112. In this case, since the film is formed by means of the CVD method, the interface of the hole 104 is completely covered by the wettability-improving film 112 (refer to FIG. 4 (c)). Instead of forming a silicon film by means of pyrolyzing disilane, a tungsten silicide film ($WSi_2$) can also be formed into a film as the wettability-improving film 112 by means of the reaction of tungsten fluoride ($WF_6$) and silane ($SiH_4$).

In this way, by means of the CVD method, a silicon film can be formed in a configuration wherein the step coverage is high, without depending on the configuration of the film forming of the barrier metal film 112 and the aspect ratio of the hole 104, such as was stated in the problem to be solved. However, with the PVD method, this sort of thing cannot be done even with the Ti and TiN, or even with the silicon.

Next, the semiconductor wafer 100 on which the wettability-improving film 112 has been formed is again moved via the buffer and transfer chambers 14, 16, this time to the susceptor within the second PVD chamber 20. After that, aluminum 114 is formed into a film at room temperature by means of the sputtering method on the semiconductor wafer 100. Continuing, the semiconductor wafer 100 is moved to the susceptor of the third PVD chamber 22, and by means of heating the semiconductor wafer 100 to about 450° C. by using the above-mentioned reflow method, along with a portion of the aluminum 114 that has been formed into a film being imbedded in the inner section 116 of the hole 104, the aluminum 114 of the semiconductor wafer 100 surface is smoothed (refer to FIG. 4 (d)).

In this invention, a portion of the silicon or tungsten that comprises the wettability-improving film 112 is uniformly dispersed in the aluminum 114. However, assuming the case that the film thickness of the silicon and the aluminum is 0.01 μm and 1 μm, respectively, the content of the silicon in the aluminum is about 1%, and since this is about the same amount as the silicon content of the aluminum that was used in the past, no particular problems are generated. Also, a suitable dispersion of the tungsten controls the electromigration (EM).

Also, in the past, in order to sufficiently cover the inner face of the hole, an extremely thick film of Ti and TiN were formed on the float section of the semiconductor wafer. Thus, when the aluminum was formed into a film on top of these; the effective aluminum that was imbedded in the inner section of the contact holes and through-holes was reduced. In addition, it reacted with the Ti and TiN films, a $TiAl_3$ having about three times the area in relation to the aluminum was generated, and as a result of that, not only was the amount of aluminum that was efficiently used reduced, but the semiconductor device was thickened. In this invention, this type of a problem is not generated.

This invention is not limited to only the case wherein the insulating film is a single layer such as in the above-mentioned utility model configuration. As is shown in FIG. 5, two insulating films 206, 208 become a multiple layer on the semiconductor substrate 202, and even in the case of a semiconductor wafer 200 wherein an electrode wiring (not illustrated) compromising aluminum is formed beforehand, the film-forming method for an aluminum material of this invention can be applied. The semiconductor wafer 200 shown in FIG. 5 has a hole 204 that has been formed by means of etching the insulating films 206, 208 which make up multiple layers (refer to FIG. 5 (a)). However, as for the side wall face 218 of this hole 204, for example, due to the differences in the etching speed of the insulating films 206, 208, since the boundary section 220 of the insulating films 206, 208 is cut away, generally, the flatness of the side wall face 218 of the hole 204 is frequently lost. Therefore, in this type of situation, the tendency is strong for the film-forming configuration of the barrier metal film 210 to become intermittent in reference to FIG. 5(b). Moreover, even though the aspect ratio of the hole 204 is about the same as in the case of even the above-mentioned utility model configuration, there is concern that the step coverage of the hole side wall 218 will become degraded to another level.

Figure 5A:
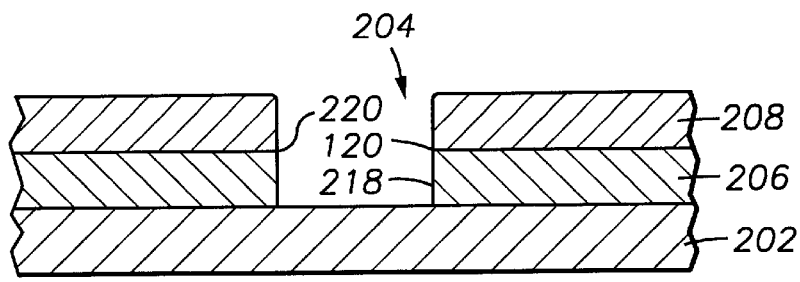
FIG. 5 is a process diagram showing another utility model configuration of the film-forming method for an aluminum material of this invention.
Figure 5B:
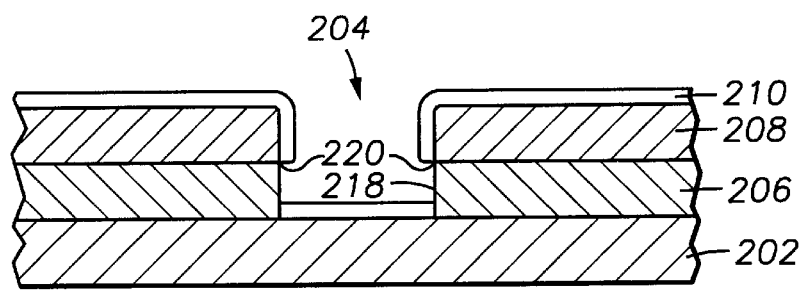
Figure 5C:
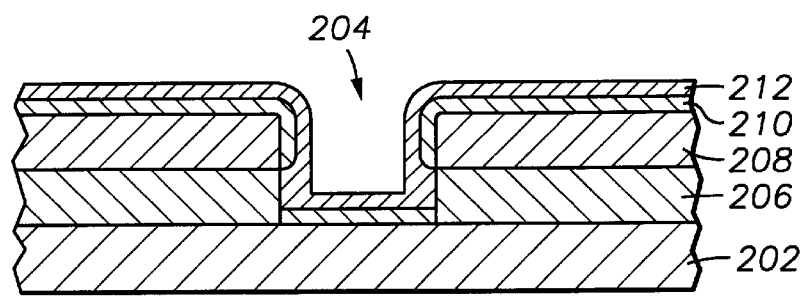
Figure 5D:
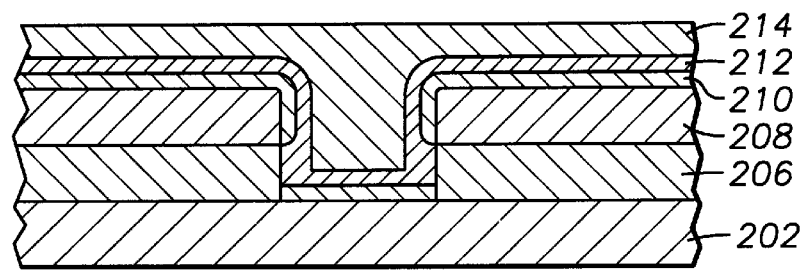

However, even in this type of situation, with this invention, as is shown in FIG. 5(c), the hole inside face can be sufficiently and completely covered by the wettability-improving film 212 by using the CVD method. Moreover, in the case of covering the wettability-improving film 212, for example, in the above-mentioned high-temperature range in which the $Si_2H_6$ is pyrolyzed, since this is a value that is lower than the melting point (660.2° C.) of aluminum, there is no exertion of an influence on the aluminum that has already been formed into a film. Thus, as was mentioned above, as a result, the aluminum 214 can be imbedded in the inner section of the hole 204 (refer to FIG. 5(d)).

Incidentally, the film forming of Ti and TiN is possible even by means of the CVD method. However, since the pyrolyzing temperature of those source gases are a higher temperature than the pyrolyzing temperature of $Si_2H_6$ when the semiconductor device is made a multilayer construction, the electrode wiring and the like of aluminum that has already been formed into a film undergoes a thermal load. Thus, as for the film-forming of the Ti and TiN by means of the CVD method, there is an influence exerted on the various characteristics of the semiconductor device that becomes the product, and at the present time, it is thought that in practice this is extremely difficult.

While the foregoing is directed to the preferred embodiment of the present invention, other and further embodiments of the invention may be devised without departing from the basic scope thereof. The scope of the invention is determined by the claims which follow.

I claim:

1. A method for planarization of a substrate layer comprising apertures, comprising the steps of:

chemical vapor depositing a silicon or metal silicide wetting layer on a substrate layer comprising apertures; and physical vapor depositing a metal layer on the wetting layer.

2. The method of claim 1, wherein the wetting layer has an initial thickness of between about 80 and about 100 Angstroms before diffusing into the metal layer.

3. The method of claim 1, wherein the physical vapor depositing initially occurs below about 400° C.

4. The method of claim 1, wherein the metal layer comprises at least 99% by weight of aluminum.

5. The method of claim 1, wherein the wetting layer completely diffuses into the metal layer to form a uniform conductive layer.

6. The method of claim 1, wherein the substrate layer comprising the apertures further comprises a barrier layer of Ti or TiN.

7. The method of claim 1, wherein the wetting layer is deposited by thermal decomposition of disilane or by reaction of $WF_6$ and $SiH_4$.

8. The method of claim 1, wherein the wetting layer and the metal layer are deposited in a multi-chamber apparatus which precludes oxidation of the wetting layer.

9. A method for planarization of a patterned dielectric layer, comprising the steps of:

depositing a Ti or TiN barrier layer on the patterned dielectric layer;

chemical vapor depositing a silicon or tungsten silicide wetting layer on the barrier layer by thermal decomposition of disilane or by reaction of $WF_6$ and $SiH_4$; and physical vapor depositing a metal layer comprising at least 99% by weight of aluminum on the wetting layer.

10. The method of claim 9, wherein the wetting layer has an initial thickness of between about 80 and about 100 Angstroms before diffusing into the metal layer.

11. The method of claim 9, wherein the physical vapor depositing initially occurs below about 400° C.

12. The method of claim 9, wherein the wetting layer completely diffuses into the metal layer to form a uniform conductive layer.

13. The method of claim 9, wherein the barrier layer, the wetting layer, and the metal layer are deposited in a multi-chamber apparatus which precludes oxidation of the wetting layer.

14. A semiconductor wafer, produced by a process comprising the steps of:

chemical vapor depositing a wetting layer comprising silicon or a metal silicide on a wafer layer comprising apertures; and physical vapor depositing a metal layer on the wetting layer.

15. The wafer of claim 14, wherein the wetting layer has an initial thickness of between about 80 and about 100 Angstroms before diffusing into the metal layer.

16. The wafer of claim 14, wherein the physical vapor depositing initially occurs below about 400° C.

17. The wafer of claim 14, wherein the metal layer comprises at least 99% by weight of aluminum.

18. The wafer of claim 14, wherein the wetting layer completely diffuses into the metal layer to form a uniform conductive layer.

19. The wafer of claim 14, wherein the substrate layer comprising apertures comprises one or more patterned dielectric layers capped by a Ti or TiN barrier layer.

20. The wafer of claim 14, wherein the wetting layer is deposited by thermal decomposition of disilane or by reaction of $WF_6$ and $SiH_4$.

21. A semiconductor wafer, produced by a process comprising the steps of:

depositing a Ti or TiN barrier layer on a patterned dielectric layer;

chemical vapor depositing a silicon or tungsten silicide wetting layer on the barrier layer by thermal decomposition of disilane or by reaction of $WF_6$ and $SiH_4$; and physical vapor depositing a metal layer comprising at least 99% by weight of aluminum on the wetting layer.

22. The wafer of claim 21, wherein the wetting layer has an initial thickness of between about 80 and about 100 Angstroms before diffusing into the metal layer.

23. The wafer of claim 21, wherein the physical vapor depositing initially occurs below about 400° C.

24. The wafer of claim 21, wherein the wetting layer completely diffuses into the metal layer to form a uniform conductive layer.

* * * * *

UNITED STATES PATENT AND TRADEMARK OFFICE
CERTIFICATE OF CORRECTION

PATENT NO. : 5,877,086

DATED : March 2, 1999

INVENTOR(S) : Aruga

It is certified that error appears in the above-indentified patent and that said Letters Patent is hereby corrected as shown below:

In Column 2, line 65, please replace "suicide" with --silicide--.

In column 7, line 3, please replace "$1 \times 10^{-7}$" with --$1 \times 10^{-9}$--.

Signed and Sealed this

Second Day of November, 1999

Attest:

Q. TODD DICKINSON

*Attesting Officer*   *Acting Commissioner of Patents and Trademarks*